US012765069B2

(12) United States Patent
Cheng et al.

(10) Patent No.: US 12,765,069 B2
(45) Date of Patent: Oct. 13, 2026

(54) SMALL DUMMY POLY PATTERN INSERTION IN SMALL BORDER REGIONS

(71) Applicant: Taiwan Semiconductor Manufacturing Company, Ltd., Hsinchu (TW)

(72) Inventors: Anhao Cheng, Taichung City (TW); Ke-Jing Yu, Kaohsiung City (TW); Meng-I Kang, Changhua County (TW); Yen-Liang Lin, Tainan City (TW); Ching Lee, Hsinchu City (TW); Pi-Tzu Chen, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 730 days.

(21) Appl. No.: 18/349,965

(22) Filed: Jul. 11, 2023

(65) Prior Publication Data

US 2025/0022870 A1 Jan. 16, 2025

(51) Int. Cl.
*H10D 89/10* (2025.01)
*G06F 30/398* (2020.01)
*H10P 52/40* (2026.01)

(52) U.S. Cl.
CPC ........... *H10D 89/10* (2025.01); *G06F 30/398* (2020.01); *H10P 52/403* (2026.01)

(58) Field of Classification Search
CPC ....... H10D 89/10; G06F 30/398; G06F 30/39; G06F 30/33; G06F 30/347; G06F 30/392; G06F 2115/08; H10P 52/403
USPC .......................................................... 716/110
See application file for complete search history.

(56) References Cited

U.S. PATENT DOCUMENTS

| | | | | |
|---|---|---|---|---|
| 2017/0017745 | A1 | 1/2017 | Wang et al. | |
| 2023/0057293 | A1 | 2/2023 | Lin et al. | |
| 2024/0005078 | A1 * | 1/2024 | Griffith | G06F 30/392 |

FOREIGN PATENT DOCUMENTS

| | | | |
|---|---|---|---|
| TW | I502273 | B | 10/2015 |
| TW | 201705026 | A | 2/2017 |
| TW | 202141638 | A | 11/2021 |

OTHER PUBLICATIONS

First office action received in the counterpart Taiwan application 113102762, mailed on Jul. 26, 2024.

* cited by examiner

*Primary Examiner* — Paul Dinh
(74) *Attorney, Agent, or Firm* — Kilpatrick Townsend & Stockton LLP

(57) ABSTRACT

A method is provided. The method includes the following steps: identifying a first intellectual property (IP) block and a second IP block in an integrated circuit; identifying a small border region between the first IP block and the second IP block, wherein the small border region has a width in a first horizontal direction, and the width is between a small border region dimension lower limit and a small border region dimension upper limit; and inserting at least one small dummy gate feature pattern in the small border region.

20 Claims, 11 Drawing Sheets

SMALL DUMMY POLY PATTERN INSERTION IN SMALL BORDER REGIONS

FIELD

Embodiments of the present disclosure relate generally to chemical mechanical polishing (CMP) dishing effect, and more particularly to small dummy gate feature pattern insertion in small border regions.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
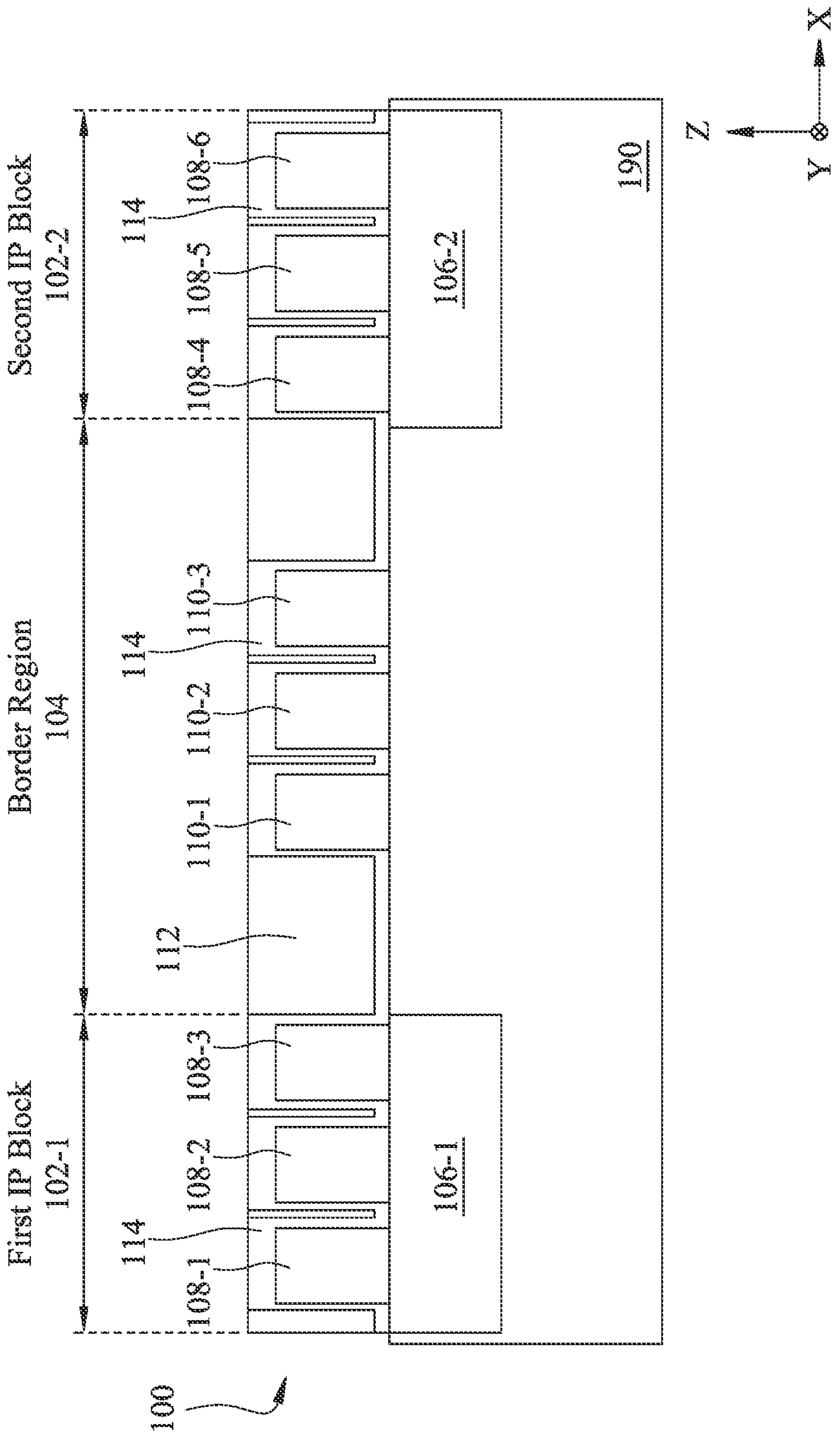
FIG. 1 is a cross-sectional diagram illustrating a portion of an integrated circuit (IC) in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Chemical mechanical polishing (CMP) dishing effect is undesirable in semiconductor fabrication. For example, it is conventionally challenging to well control the thickness of the gate metal layer of a large dimension metal gate field-effect transistor (FET) due to the CMP dishing effect. The CMP dishing effect causes a nonplanar surface at the top surface of the structure. The edge portion of the gate metal layer is generally thicker than the central portion of the gate metal layer. The mismatch in thickness results in the mismatch in the threshold voltage of the large dimension metal gate FET, which may even cause functional failure.

As another example, for gate-last metal-oxide-semiconductor FET (MOSFET) fabrication processes where metal gate structures (or, alternatively, high-k gate structures) are employed, CMP dishing effect can cause under-polish defects of the metal gate structures. When polysilicon is etched to create openings for p-type metal gate structures in the PMOS region, CMP dishing effect can cause a nonplanar surface at the top surface of the border region between the PMOS region and the complementary NMOS region. In some situations, a nonplanar surface at the top surface of the complementary NMOS region may be created at the place that is close to the border region. As a result, p-type metal gate structures will be formed subsequently in the complementary NMOS region, thereby causing under-polish defects from the perspective of the complementary NMOS region (because P-type metal gate has not been fully polished). The under-polish defects may cause reliability issues and production loss.

In fact, this may occur to not just complementary metal-oxide-semiconductor (CMOS) processes. This CMP dishing effect can cause under-polish defects in integrated circuits (ICs) having two or more semiconductor intellectual property cores (SIP cores, or alternatively "IP cores," or IP blocks) and border regions therebetween. An IP block is a reusable unit of logic, cell, or IC layout design that is the intellectual property of one party or one vendor. IC designers can use these IP blocks as building blocks. For some IP blocks such as static random access memory (SRAM) IP blocks, the density of gate structures is relatively high. This high density in these IP blocks, in contrast to the relatively low density of gate structures or even no gate structures in the border regions, will cause more under-polish defects.

Dummy patterns are usually used for relatively large chip areas. For example, gate feature (sometimes also referred to as "POLY") dummy patterns and active region (sometimes also referred to as "oxide diffusion (OD) region) dummy patterns are used for border regions wider than 3.6 μm (in a first horizontal direction) and longer than 3.6 μm (in a second horizontal direction) according to some design rules. Active region dummy patterns, gate feature dummy patterns, or the combination of active region dummy patterns and gate feature dummy patterns are inserted in border regions longer than 3.6 μm or wider than 3.6 μm.

In accordance with other aspects of the disclosure, an integrated circuit (IC) is provided. The IC includes, among other components, a first IP block, a second IP block, and a small border region (sometimes also referred to as a "compact border region") between the first IP block and the second IP block. The small border region, which is relative to a large border region (sometimes also referred to as a "spacious border region"), has a width in a first horizontal direction and a length in a second horizontal direction perpendicular to the first horizontal direction. At least one of the width and the length is between a small border region dimension lower limit and a small border region dimension upper limit. In one embodiment, the small border region dimension upper limit is 3.6 μm, and wherein the small border region dimension lower limit is 0.5 μm. As such, the small border region is a region where dummy POLY patterns are not conventionally inserted. At least one small dummy POLY pattern (sometimes also referred to as a "compact dummy POLY pattern") is disposed in the small border region. The at least one small dummy POLY pattern may include multiple small dummy POLY patterns, for example, organized in an array.

In some embodiments, each small dummy POLY pattern is elongated and extends in the second horizontal direction, having a width in the first horizontal direction between 0.01 μm and 0.2 μm and a length in the second horizontal direction between 0.1 μm and 0.5 μm. In other embodiments, each small dummy POLY pattern is elongated and extends in the first horizontal direction, having a width in the first horizontal direction between 0.1 μm and 0.5 μm and a length in the second horizontal direction between 0.01 μm and 0.2 μm.

With the small dummy POLY patterns disposed in the small border region, the CMP dishing effect can be mitigated or minimized due to the heterogeneous nature of the materials (i.e., including both the small dummy POLY patterns and the dielectric layer) in the small border region. A flat or substantially flat top surface can be achieved in the border region after the CMP process.

Small Dummy POLY Patterns Inserted in a Small Border Region

Figure 2:
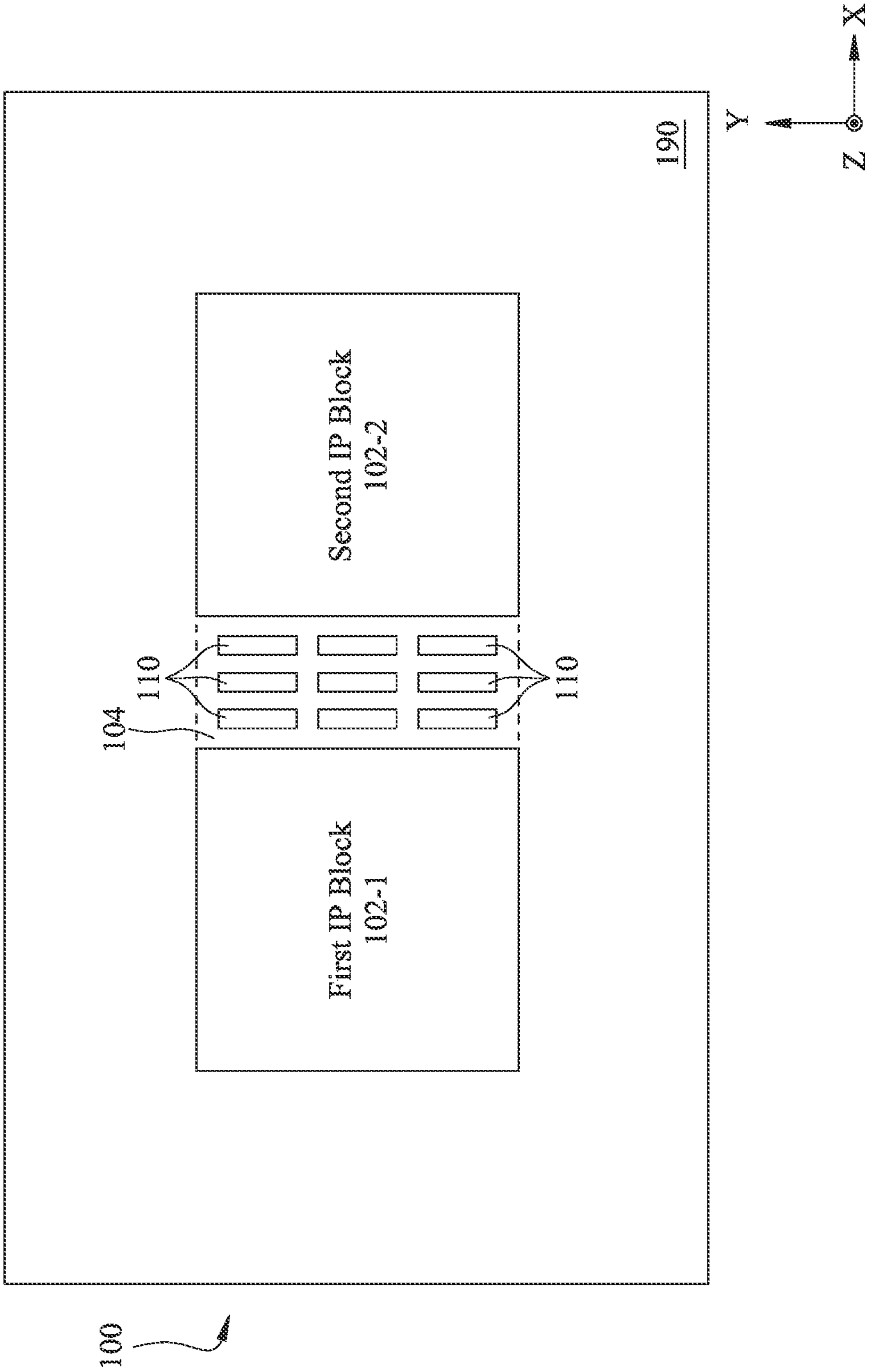
FIG. 2 is a diagram illustrating a top view of the IC 100 shown in FIG. 1 in accordance with some embodiments.
Figure 3:
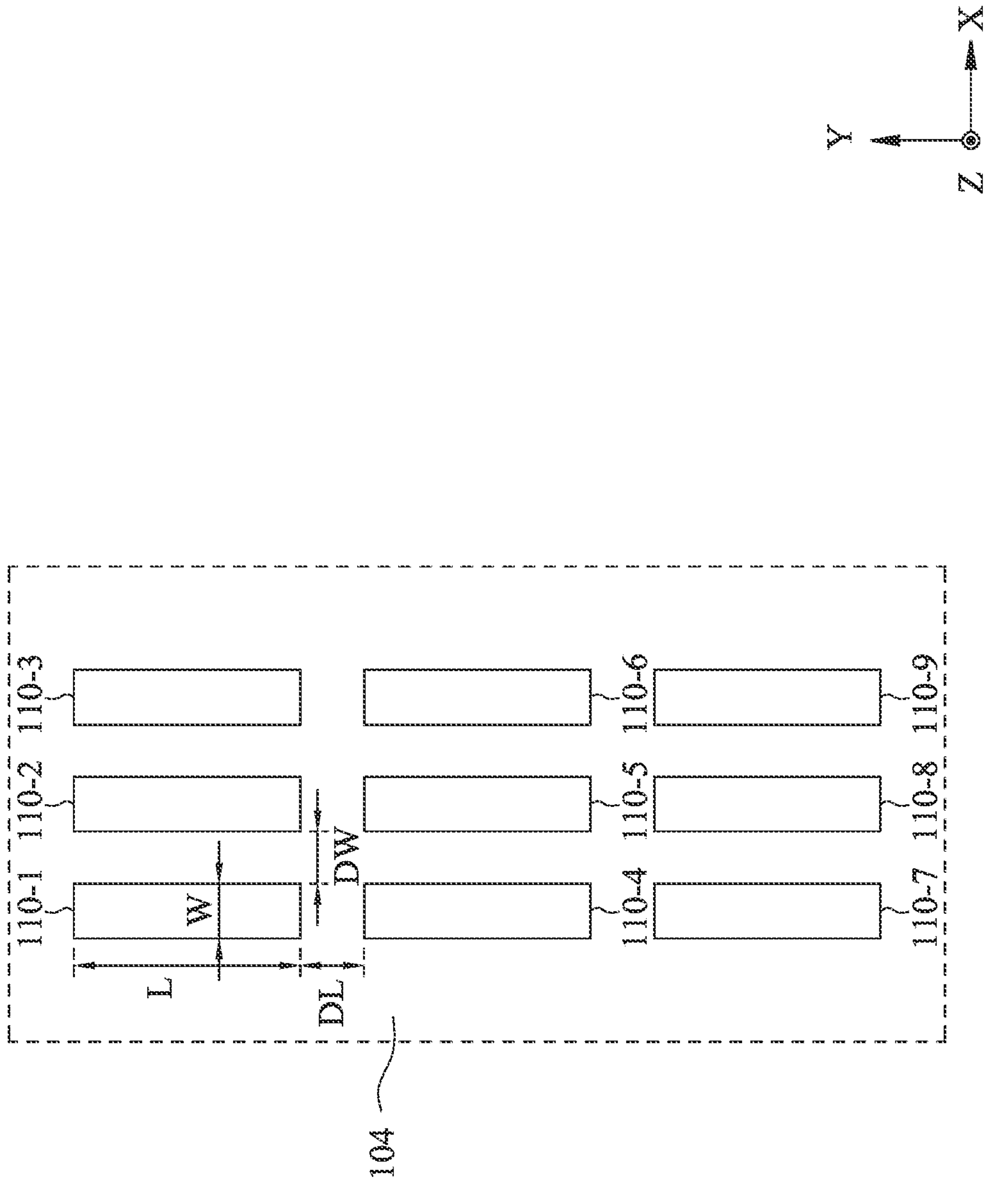
FIG. 3 is a diagram illustrating a small border region in accordance with some embodiments.

FIG. 1 is a cross-sectional diagram illustrating a portion of an integrated circuit (IC) 100 in accordance with some embodiments. FIG. 2 is a diagram illustrating a top view of the IC 100 shown in FIG. 1 in accordance with some embodiments. FIG. 3 is a diagram illustrating a small border region in accordance with some embodiments. It should be understood that FIGS. 1-3 are not drawn to scale.

In the example shown in FIGS. 1-2, the IC 100 is fabricated on a substrate 190. In some embodiments, the substrate 190 is a single crystal silicon substrate. In other embodiments, the substrate 190 may be other types of substrate such as a silicon on insulator (SOI) substrate. The IC 100 includes a first IP block 102-1 and a second IP block 102-2. The first IP block 102-1 is a reusable unit of logic, cell, or IC layout design; the second IP block 102-2 is another reusable unit of logic, cell, or IC layout design. In one example, the first IP block 102-1 is an SRAM IP block, the second IP block 102-2 is another SRAM IP block. As discussed above, the density of gate structures in these SRAM IP blocks is relatively high. It should be understood that the example shown in FIGS. 1-2 is exemplary rather than limiting, and the IC 100 may include more than two IP blocks in other embodiments.

A small border region 104 is located between the first IP block 102-1 and the second IP block 102-2 in a first horizontal direction (i.e., the X-direction shown in FIG. 1). As shown in FIG. 2, the small border region 104 has a width in the first horizontal direction (i.e., the X-direction shown in FIG. 2) and a length in the second horizontal direction (i.e., the Y-direction shown in FIG. 2). In one example, the width of the small border region 104 is between 0.5 μm and 3.6 μm. As compared to other border regions (sometimes referred to as "(relatively) large border regions") that are wider than 3.6 μm (in a first horizontal direction) and longer than 3.6 μm (in a second horizontal direction), the small border region 104 is a (relatively) small border region. It should be understood that, in other embodiments, a border region is a (relatively) small border region when the length, in the Y-direction shown in FIG. 2, of the border region is between 0.5 μm and 3.6 μm or when both the length in the Y-direction shown in FIG. 2 and the width in the X-direction shown in FIG. 2 are between 0.5 μm and 3.6 μm.

It should be understood that the range from 0.5 μm to 3.6 μm is not chosen arbitrarily. For border regions wider or longer than 3.6 μm, large dummy patterns (including large or spacious dummy POLY patterns and large or spacious dummy OD patterns) have been employed. For border regions narrower or shorter than 0.5 μm, CMP dishing effect is not severe enough to cause a problematic under-polish effect because the border region is not large enough. It should be understood that although 0.5 μm and 3.6 μm are chosen, based on observation and experimentation, in the embodiment discussed above, the principles disclosed herein are generally applicable. In general, the value of 3.6 μm is a specific example of a small border region dimension upper limit; the value of 0.5 μm is a specific example of a small border region dimension lower limit.

Referring back to FIG. 1, a first active region (sometimes also referred to as a "first oxide diffusion (OD) region") pattern 106-1 is located in the first IP block 102-1 at the cross-section shown in FIG. 1; a second active region (sometimes also referred to as a "second oxide diffusion (OD) region") pattern 106-2 is located in the second IP block 102-2 at the cross-section shown in FIG. 1. The first OD region pattern 106-1 and the second OD region pattern 106-2 may extend in the X-direction. It should be understood that multiple other first OD region patterns may exist in the first IP block 102-1 at other cross-sections and be parallel to the first OD region pattern 106-1, and multiple other second OD region patterns may exist in the second IP block 102-2 at other cross-sections and be parallel to the second OD region pattern 106-2.

In the first IP block 102-1, multiple gate feature ("POLY") patterns 108-1, 108-2, and 108-3 are disposed on the first OD region pattern 106-1. The POLY patterns 108-1, 108-2, and 108-3 are placeholders for gate structures to be fabricated in a later stage of the fabrication process. For instance, the POLY patterns 108-1, 108-2, and 108-3 are made of polysilicon and will be etched subsequently, followed by forming p-type metal gate structures therein. Each of the p-type metal gate structures is formed on the first OD region pattern 106-1, as shown in FIG. 1. In other embodiments, each of the p-type metal gate structures is formed over the first OD region pattern 106-1, with intervening layers therebetween. In one embodiment, the intervening layers include a first gate dielectric layer, a second gate dielectric layer, and a third gate dielectric layer. In one example, the first gate dielectric layer is a gate oxide layer; the second gate dielectric layer is a high-dielectric layer; the third gate dielectric layer is a titanium nitride (TiN) layer. It should be understood that the gate more or fewer gate dielectric layers may be employed in other embodiments. It should also be understood that other combinations of materials may be employed as needed.

The POLY patterns 108-1, 108-2, and 108-3 extend in the Y-direction shown in FIG. 1. In other words, the POLY patterns 108-1, 108-2, and 108-3 are substantially perpendicular to the first OD region pattern 106-1. It should be understood that although three POLY patterns 108-1, 108-2, and 108-3 are shown in FIG. 1, fewer or more than three POLY patterns can be disposed on the first OD region pattern 106-1 in other embodiments.

Likewise, in the second IP block 102-2, multiple gate feature ("POLY") patterns 108-4, 108-5, and 108-6 are disposed on the second OD region pattern 106-2. The POLY patterns 108-4, 108-5, and 108-6 are placeholders for gate structures to be fabricated in a later stage of the fabrication process. For instance, the POLY patterns 108-4, 108-5, and 108-6 are made of polysilicon and will be etched subsequently, followed by forming n-type metal gate structures therein. Each of the n-type metal gate structures be formed on the second OD region pattern 106-2, as shown in FIG. 1. In other embodiments, each of the n-type metal gate structures be formed over the second OD region pattern 106-2, with intervening layers therebetween. In one embodiment, the intervening layers include a first gate dielectric layer, a second gate dielectric layer, and a third gate dielectric layer. In one example, the first gate dielectric layer is a gate oxide layer; the second gate dielectric layer is a high-K dielectric layer; the third gate dielectric layer is a titanium nitride (TiN) layer. It should be understood that the gate more or fewer gate dielectric layers may be employed in other embodiments. It should also be understood that other combinations of materials may be employed as needed.

The POLY patterns 108-4, 108-5, and 108-6 extend in the Y-direction shown in FIG. 1. In other words, the POLY patterns 108-4, 108-5, and 108-6 are substantially perpendicular to the second OD region pattern 106-2. It should be understood that although three POLY patterns 108-4, 108-5, and 108-6 are shown in FIG. 1, fewer or more than three POLY patterns can be disposed on the second OD region pattern 106-2 in other embodiments.

In some embodiments, the p-type metal gate structures comprise a first material, while the n-type metal gate structures comprise a second material. The first material and the second material may be a single metal, a compound metal, or an alloy. In some embodiments, the first material is a first metal, whereas the second material is a second metal different from the first metal. In some embodiments, the first material has a first metal work function, whereas the second material has a second metal work function equal to or higher than the first metal work function. In some embodiments, the first work function is in a range from about 3.0 eV to about 4.5 eV. In some embodiments, the second work function is in a range from about 4.5 eV to about 5.2 eV. In some embodiments, the second work function is equal to or more than the first work function. It should be understood that the examples above are not intended to be limiting, and other materials may also be possible choices in alternative embodiments.

Multiple small dummy POLY patterns 110-1, 110-2, and 110-3 (collectively "110") are disposed over the substrate 190 in the small border region 104. The small dummy POLY patterns 110-1, 110-2, and 110-3 are not used for the fabrication of any devices. Nor are they used as placeholders for any structures to be fabricated in a later stage of the fabrication process. Instead, small dummy POLY patterns 110-1, 110-2, and 110-3 are used for mitigating CMP dishing effect, as will be discussed in detail below.

A contact etching stop layer (CESL) 114 is disposed on top surfaces of the POLY patterns 108-1, 108-2, 108-3, 108-4, 108-5, and 108-6 (collectively "108") and the small dummy POLY patterns 110-1, 110-2, and 110-3. The contact etching stop layer 114 also covers sidewalls of the POLY patterns 108-1, 108-2, 108-3, 108-4, 108-5, and 108-6, and the small dummy POLY patterns 110-1, 110-2, and 110-3. The contact etching stop layer 114 also covers other portions of the top surface of the substrate 190. The contact etching stop layer 114 may include a dielectric material such as silicon nitride or carbon-doped silicon nitride. The contact etching stop layer 114 may be formed by a deposition technique such as CVD, plasma-enhanced CVD (PECVD), sub-atmospheric CVD (SACVD), molecular layer deposition (MLD), sputtering, or other suitable techniques.

A dielectric layer 112 is disposed on the contact etching stop layer 114 except the top surfaces of the contact etching stop layer 114 that are on the POLY patterns 108-1, 108-2, 108-3, 108-4, 108-5, and 108-6 and the small dummy POLY patterns 110-1, 110-2, and 110-3. The top surfaces of the contact etching stop layer 114 that are on the POLY patterns 108-1, 108-2, 108-3, 108-4, 108-5, and 108-6 and the small dummy POLY patterns 110-1, 110-2, and 110-3 are exposed after a planarization process such as a CMP process.

The dielectric layers 112 may comprise low-k dielectric materials (materials having a dielectric constant lower than silicon dioxide). In other embodiments, the dielectric layers 112 may comprise extremely low-k (ELK) dielectric materials (materials having a dielectric constant lower than less than 3.9). In some examples, the dielectric layers 120 may comprise undoped silicon glass (USG), phosphosilicate glass (PSG), and silicon oxynitride ($SiN_xO_y$).

It is noted that the CMP process can have selectivity between the polysilicon of the POLY patterns 108-1, 108-2, 108-3, 108-4, 108-5, and 108-6 and the dielectric of the dielectric layer 112, due to their different resistivities or polishing rates against the chemicals used in the CMP process. Without the small dummy POLY patterns 110-1, 110-2, and 110-3 disposed in the small border region 104, as in a conventional IC, this CMP selectivity can cause CMP dishing effect in the small border region 104 and, therefore, under-polish defects. In contrast, with the small dummy POLY patterns 110-1, 110-2, and 110-3 disposed in the small border region 104, as shown in FIG. 1, the CMP dishing effect can be mitigated or minimized because of the existence of the small dummy POLY patterns 110-1, 110-2, and 110-3. Due to the heterogeneous nature of the materials (i.e., including both the small dummy POLY patterns 110-1, 110-2, and 110-3 and the dielectric layer 112) in the small border region 104, a flat or substantially flat top surface can be achieved in the border region 104 after the CMP process.

In the example shown in FIG. 2, the small dummy POLY patterns 110 form an array of three rows and three columns. It should be understood that this example is not intended to be limiting, and the small dummy POLY patterns 110 may form other topologies as needed, subject to some design rules, which will be discussed in detail below.

In the example shown in FIG. 3, the small dummy POLY patterns 110-1, 110-2, 110-3, 110-4, 110-5, 110-6, 110-7, 110-8, and 110-9 (collectively "110") are organized in a three-by-three array. Each of the small dummy POLY patterns 110 has an elongated shape, with a width (denoted as "W" in FIG. 3) in the X-direction and a length (denoted as "L" in FIG. 3) in the Y-direction. In some embodiments, the width is between 0.01 μm and 0.2 μm. In one example, the width is 0.03 μm. In some embodiments, the length is between 0.1 μm and 0.5 μm. In one example, the length is 0.1 μm.

Two neighboring small dummy POLY patterns 110 are aligned and spaced in the X-direction, with a width distance (denoted as "DW" in FIG. 3) in the X-direction. Two neighboring small dummy POLY patterns 110 are spaced in the Y-direction, with a length distance (denoted as "DL" in FIG. 3) in the Y-direction. In some embodiments, the width distance is between 0.05 μm and 0.2 μm. In one example, the width distance is 0.1 μm. In some embodiments, the length distance is between 0.05 μm and 0.2 μm. In one example, the length distance is 0.1 μm. As will be discussed below, the small dummy POLY patterns have a relatively smaller geometry than dummy POLY patterns that are inserted outside the small border region 104.

Although the small dummy POLY patterns 110 shown in FIG. 3 are elongated and extend in the Y-direction (may be referred to as "vertical small dummy POLY patterns"), it should be understood that small dummy POLY patterns 110 may also be elongated and extend in the X-direction (may be referred to as "horizontal small dummy POLY patterns") in other embodiments. In other words, the small dummy POLY patterns 110 can be rotated by 90 degrees in other embodiments. The geometries discussed above in relation to the vertical small dummy POLY patterns with reference to FIG. 3 are also applicable to horizontal small dummy POLY patterns.

Example EDA Implementation

In an electronic circuit design process, one or more electronic design automation (EDA) tools may be utilized to design, optimize, and verify semiconductor device designs, such as circuit designs in a semiconductor chip. During placement, a placer tool may produce an (electronic circuit) placement layout based on a given circuit design, which may be developed by a circuit designer and which may include, for example, circuit design information such as electrical diagrams, high level electrical description of the circuit design, a synthesized circuit netlist, or the like. The placement layout includes information indicating physical positions of various circuit elements of the semiconductor device. After the placement of the device is completed, clock-tree synthesis and routing may be performed. During routing, wires or interconnections may be formed to connect the various circuit elements of the placement layout.

After the placement layout has been routed, the resulting electronic device design may be checked for compliance with various design rules, design specifications, or the like. For example, the electronic device design may be checked for various design rule check (DRC) violations. Some DRC violations may be caused by routing congestion, for example, as routing lines may become congested in certain regions of the electronic device design, which can result in DRC violations.

Figure 4:
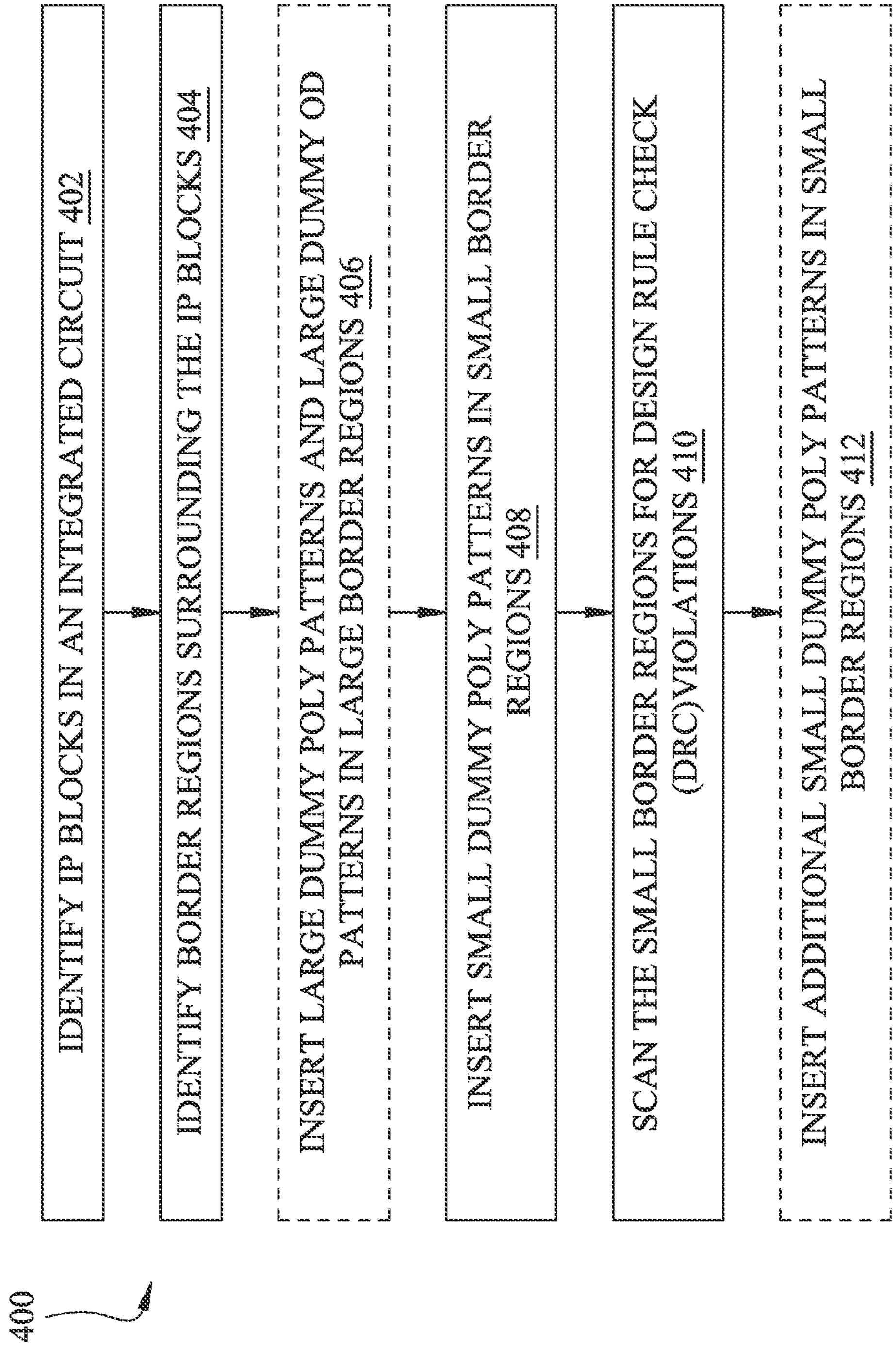
FIG. 4 is a flowchart diagram illustrating an example method in accordance with some embodiments.

FIG. 4 is a flowchart diagram illustrating an example method 400 in accordance with some embodiments. In the example shown in FIG. 4, the method 400 includes operations 402, 404, 406, 408, 410, and 412. Additional operations may be performed. Also, it should be understood that the sequence of the various operations discussed above with reference to FIG. 4 is provided for illustrative purposes, and as such, other embodiments may utilize different sequences. For example, operation 408 may be performed either before or after operation 406 is performed. These various sequences of operations are to be included within the scope of embodiments.

Figure 5:
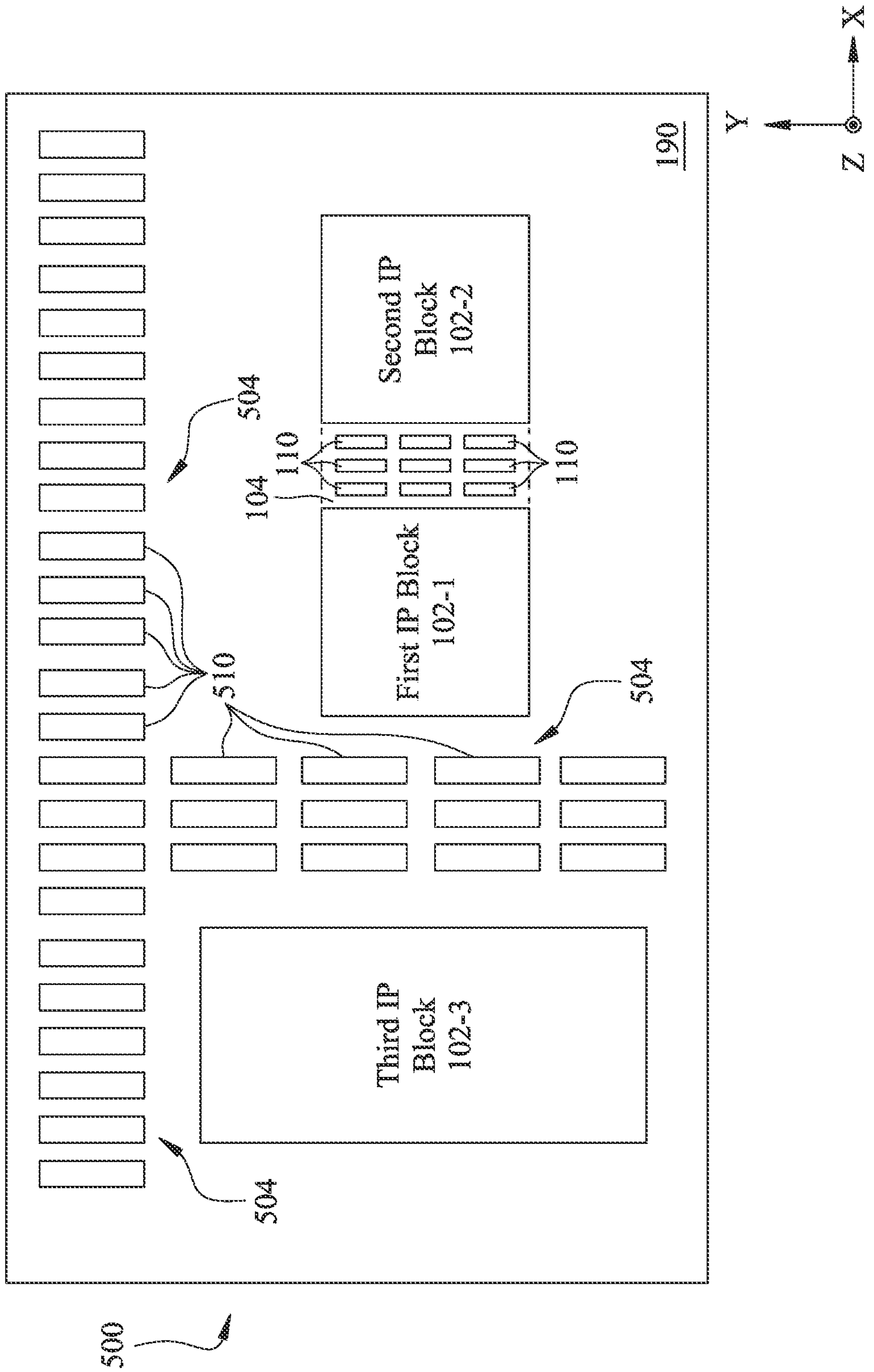
FIG. 5 is a diagram illustrating a top view of an example IC in accordance with some embodiments.

At operation 402, IP blocks in an IC is identified. In some implementations, the IP blocks in the IC can be identified by EDA tools. An example EDA tool will be discussed below with reference to FIG. 11. FIG. 5 is a diagram illustrating a top view of an example IC 500 in accordance with some embodiments. In the example shown in FIG. 5, the IC 500 includes three IP blocks, namely the first IP block 102-1, the second IP block 102-2, and the third IP block 102-3. It should be understood that this is not intended to be limiting, and fewer or more IP blocks can be included in an IC in other embodiments.

At operation 404, border regions are identified. In some implementations, the IP blocks in the IC can be identified by EDA tools. Border regions are regions on the IC that are outside IP blocks. A border region may be surrounding an IP block, between two IP blocks, or adjacent to an IP block. In one embodiment, both larger border regions and small border regions are identified.

As discussed above, a small border region has a width in the first horizontal direction (i.e., the X-direction shown in FIG. 5) and a length in the second horizontal direction (i.e., the Y-direction shown in FIG. 5), and the width is between 0.5 μm and 3.6 μm or the length is between 0.5 μm and 3.6 μm or both the width and the length are between 0.5 μm and 3.6 μm. A large border region has a width in the first horizontal direction (i.e., the X-direction shown in FIG. 5) and a length in the second horizontal direction (i.e., the Y-direction shown in FIG. 5), and the width is larger than 3.6 μm and the length is larger than 3.6 μm. It should be understood that a small border region is small relative to a large border region.

In the example shown in FIG. 5, a small border region 104 is identified. The small border region 104 is between the first IP block 102-1 and the second IP block 102-2, and width in the X-direction of the small border region 104 is between 0.5

μm and 3.6 μm (e.g., 3 μm). Some large border regions 504 that are identified are also illustrated in FIG. 5. It should be understood that FIG. 5 is illustrative, and not every small border region 104 and large border region 504 in the IC 500 shown in FIG. 5 are necessarily pointed out.

Optionally, at operation 406, large dummy POLY patterns are inserted in large border regions. In some implementations, the large dummy POLY patterns can be inserted in the large border regions by EDA tools. In the example shown in FIG. 5, large dummy POLY patterns 510 are inserted in large border regions 504, in compliance with design rules. The large dummy POLY patterns 510 are large relative to small dummy POLY patterns 110, which will be discussed below. In some embodiments, both the width (in the X-direction shown in FIG. 5) and the length (in the Y-direction shown in FIG. 5) of the large dummy POLY patterns 510 are larger than the width and the length of the small dummy POLY patterns 110, respectively.

In other embodiments, dummy OD patterns may be inserted in conjunction with the large dummy POLY patterns 510 as a combination. For instance, a set of parallel dummy OD patterns and a set of parallel large dummy POLY patterns 510 are inserted together, and the parallel dummy OD patterns are perpendicular to the parallel large dummy POLY patterns 510. In yet other embodiments, dummy OD patterns may be inserted independently, and large dummy POLY patterns 510 are inserted independently as well. It should also be understood that only dummy OD patterns, in some embodiments, are inserted in the large border region 504.

At operation 408, small dummy POLY patterns are inserted in small border regions. In some implementations, the large dummy POLY patterns can be inserted in the large border regions by EDA tools. In the example shown in FIG. 5, the small dummy POLY patterns 110 are inserted in the small border region 104, in compliance with design rules. For example, as discussed above, the length distance (denoted as "DL" in FIG. 3) in the Y-direction between two neighboring small dummy POLY patterns 110 is between 0.05 μm and 0.2 μm; the width distance (denoted as "DW" in FIG. 3) in the X-direction between two neighboring small dummy POLY patterns 110 is between 0.05 μm and 0.2 μm. Likewise, the small dummy POLY patterns 110 are small relative to large dummy POLY patterns 510. In some embodiments, both the width (in the X-direction shown in FIG. 5) and the length (in the Y-direction shown in FIG. 5) of the small dummy POLY patterns 110 are smaller than the width and the length of the large dummy POLY patterns 510, respectively.

Figure 6:
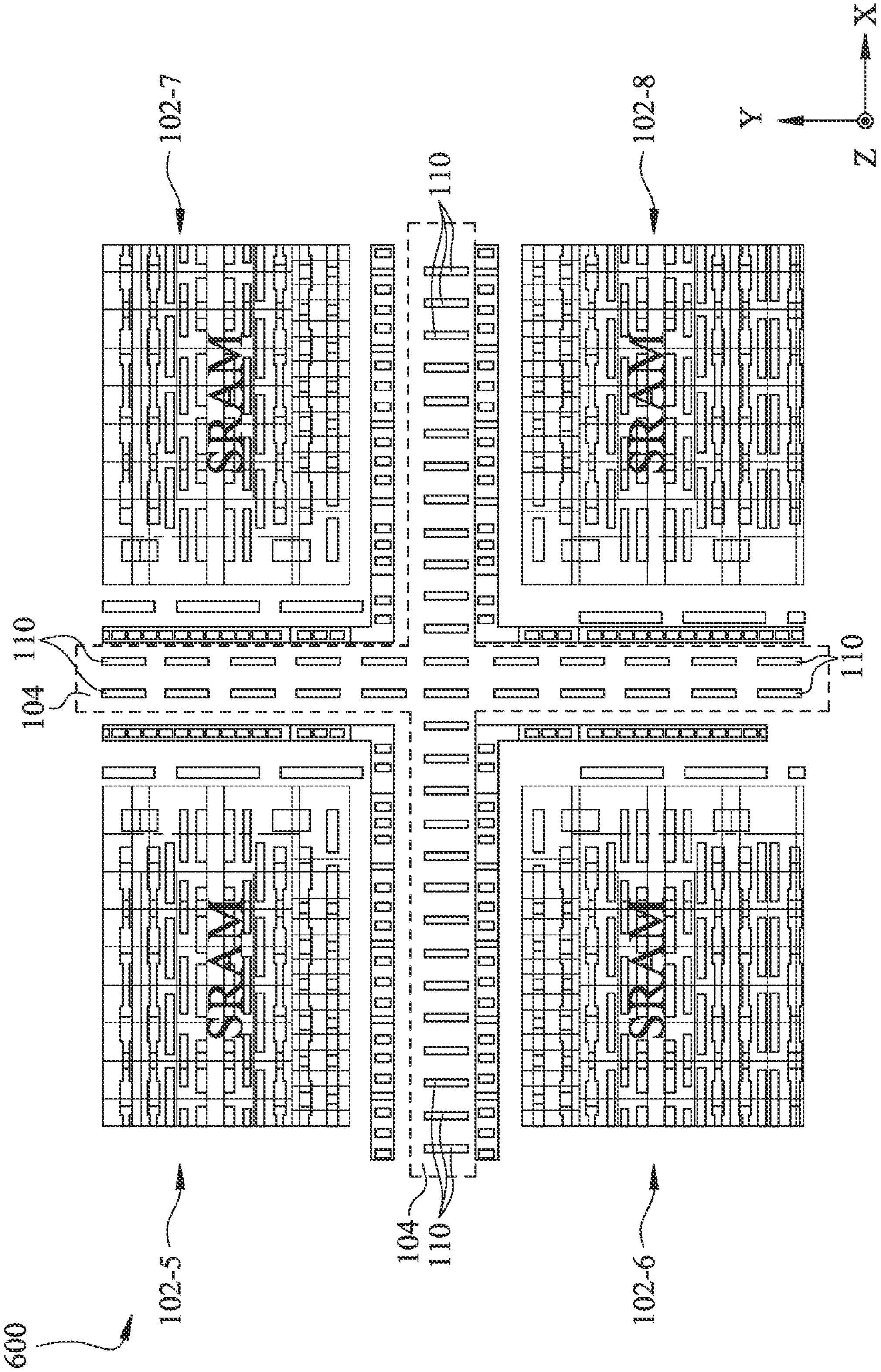
FIG. 6 is a diagram illustrating an example IC in accordance with some embodiments.

FIG. 6 is a diagram illustrating an example IC 600 in accordance with some embodiments. In the example shown in FIG. 6, the IC 600 includes four IP blocks 102-5, 102-6, 102-7, and 102-8, all of which are SRAM IP blocks. A small border region 104 having a "cross shape" is located in the IC 600, separating the IP blocks 102-5, 102-6, 102-7, and 102-8 from each other.

At operation 410, the small border regions are scanned for design rule check (DRC) violations. In some implementations, the small border regions are scanned for DRC violations by EDA tools. DRC violations related to the small border regions may include violations of various of design rules.

Figure 7:
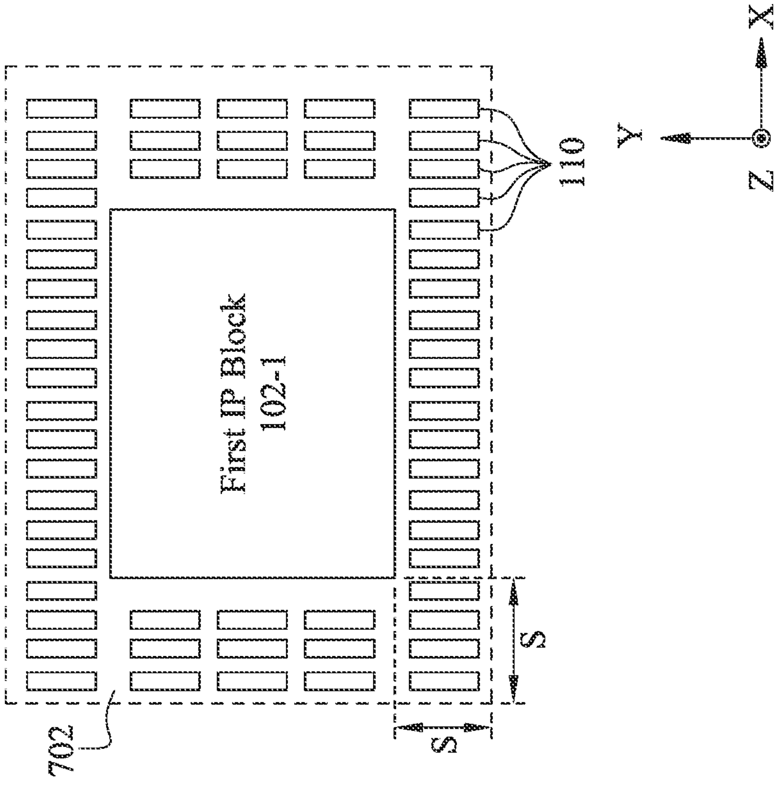
FIG. 7 is a diagram illustrating a fringe region of an IP block in accordance with some embodiments.

A first design rule is discussed below with reference to FIG. 7. FIG. 7 is a diagram illustrating a fringe region of an IP block in accordance with some embodiments. In the example shown in FIG. 7, a fringe region 702 surrounds the first IP block 102-1. The fringe region 702 is a region that wider than the first IP block 102-1, at each side, by a distance S in the X-direction and longer than the first IP block 102-1, at each side, by the same distance S in the Y-direction. In one embodiment, the distance S is 3.6 μm. It should be understood that other values of the distance S may be employed in other embodiments. According to the first rule, at least one dummy POLY patterns must overlap with the fringe region 702. In the example shown in FIG. 7, multiple small dummy POLY patterns 110 overlap with the fringe region 702. In fact, these small dummy POLY patterns 110 shown in FIG. 7 are located in the fringe region 702. In other embodiments, one or more large dummy POLY patterns may overlap with the fringe region 702. If there is no small dummy POLY pattern 110 or large dummy POLY pattern 510 (like the ones shown in FIG. 5) overlapping with the fringe region 702, the first rule is violated. A corresponding DRC violation may be shown in a DRC violation report.

Figure 8:
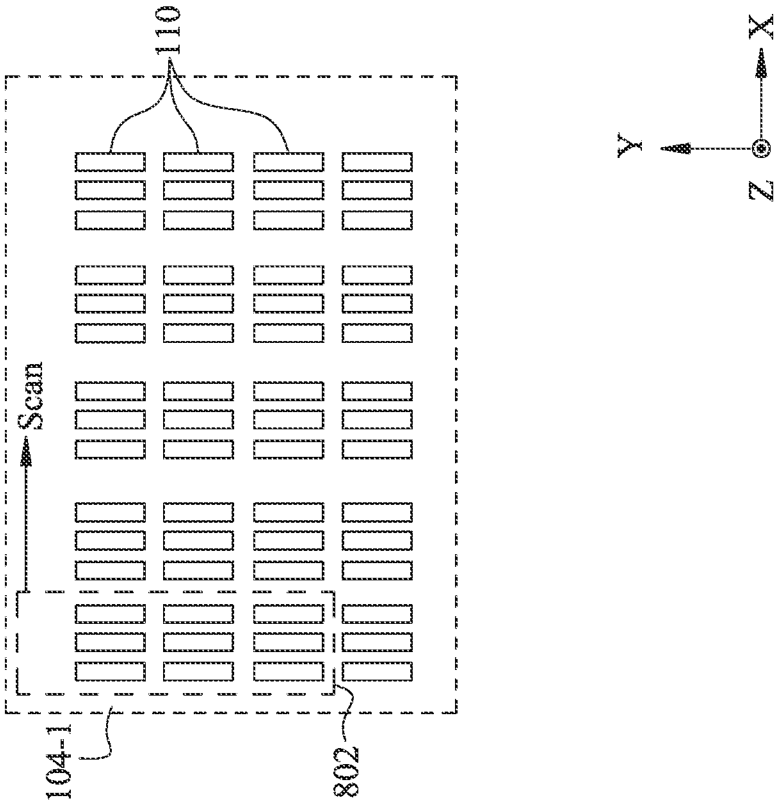
FIG. 8 is a diagram illustrating the scanning, using a vertical rectangular, of a portion of a small border region in accordance with some embodiments.
Figure 10:
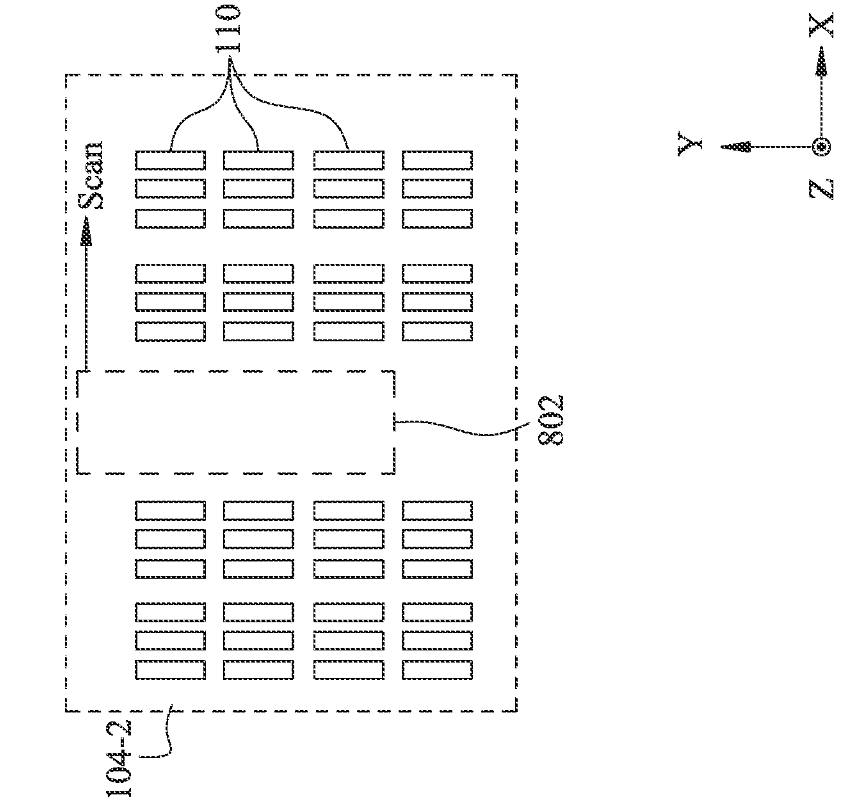
FIG. 10 is a diagram illustrating the failure of the second design rule in accordance with some embodiments.
Figure 9:
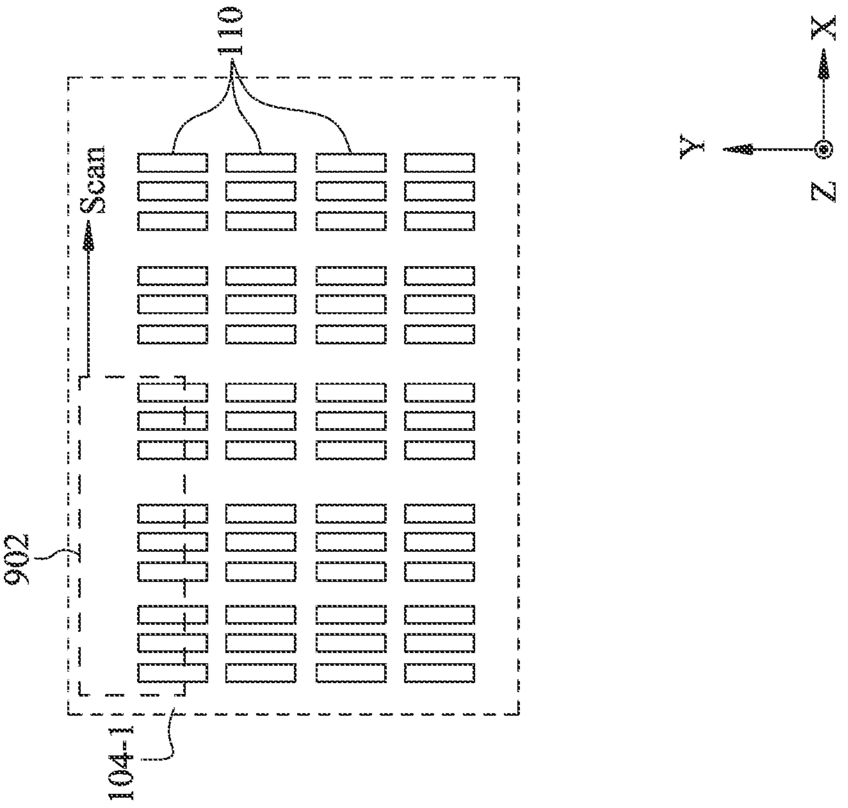
FIG. 9 is a diagram illustrating the scanning, using a horizontal rectangular, of a portion of a small border region in accordance with some embodiments.

A second design rule is discussed below with reference to FIGS. 8-10. FIG. 8 is a diagram illustrating the scanning, using a vertical rectangular, of a portion of a small border region in accordance with some embodiments. FIG. 9 is a diagram illustrating the scanning, using a horizontal rectangular, of a portion of a small border region in accordance with some embodiments. FIG. 10 is a diagram illustrating the failure of the second design rule in accordance with some embodiments.

According to the second design rule, in any rectangular area that has a width of 0.5 μm and a length of 10 μm (or a width of 10 μm and a length of 0.5 μm) within the small border region 104, there must be at least a portion of a small dummy POLY pattern 110. In other words, no POLY-free rectangular area having a size of 10 μm by 0.5 μm or 0.5 μm by 10 μm can exist in the small border region 104.

In the example shown in FIG. 8, a vertical rectangular area 802 having a size of 0.5 μm by 10 μm (i.e., a width of 0.5 μm in the X-direction and a length of 10 μm in the Y-direction, as shown in FIG. 8) is used to scan the portion 104-1 of the small border region 104. As shown in FIG. 8, the starting location of the vertical rectangular area 802 is the top-left corner of the portion 104-1, and the scanning is in the first scanning direction (e.g., the X-direction shown in FIG. 8) and then in the second scanning direction (e.g., the Y-direction shown in FIG. 8). As a result, the entire area of the portion 104-1 is scanned by the vertical rectangular area 802. If, at any time of the scanning process, there is always at least a portion of a small dummy POLY pattern 110 in the vertical rectangular area 802, the second design rule is met, assuming that the second design rule using the horizontal rectangular area 902, which will be discussed below with reference to FIG. 9, is met as well. If, at any time of the scanning process, the vertical rectangular area 802 becomes a POLY-free rectangular area (i.e., not any portion of a small dummy POLY pattern 110 exists in the vertical rectangular area 802), the second design rule is violated. Therefore, the second design rule can ensure a certain minimum density of the small dummy POLY pattern 110 in the portion 104-1 of the small border region 104. It should be understood that the scanning manner described above is not intended to be limiting, and other scanning manners can be employed as long as the entire area of the portion 104-1 is scanned by the vertical rectangular area 802.

In the example shown in FIG. 9, a horizontal rectangular area 902 having a size of 10 μm by 0.5 μm (i.e., a width of 10 μm in the X-direction and a length of 0.5 μm in the Y-direction, as shown in FIG. 9) is used to scan the portion 104-1 of the small border region 104. As shown in FIG. 9, the starting location of the horizontal rectangular area 902 is the top-left corner of the portion 104-1, and the scanning is in the first scanning direction (e.g., the X-direction shown in FIG. 8) and then in the second scanning direction (e.g., the Y-direction shown in FIG. 8). As a result, the entire area of the portion 104-1 is scanned by the horizontal rectangular area 902. If, at any time of the scanning process, there is always at least a portion of a small dummy POLY pattern 110 in the horizontal rectangular area 902, the second design rule is met, assuming that the second design rule using the vertical rectangular area 802 discussed above is met as well. If, at any time of the scanning process, the horizontal rectangular area 902 becomes a POLY-free rectangular area (i.e., not any portion of a small dummy POLY pattern 110 exists in the horizontal rectangular area 902), the second design rule is violated. Therefore, the second design rule can ensure a certain minimum density of the small dummy POLY pattern 110 in the portion 104-1 of the small border region 104. It should be understood that the scanning manner described above is not intended to be limiting, and other scanning manners can be employed as long as the entire area of the portion 104-1 is scanned by the horizontal rectangular area 902.

In the example shown in FIG. 10, at the moment shown in FIG. 10, the vertical rectangular area 802 becomes a POLY-free rectangular area. Accordingly, the second design rule is violated, suggesting that the density of the small dummy POLY pattern 110 in the portion 104-2 of the small border region 104 is not high enough at some location(s). This violation may trigger operation 412, as will be discussed below.

Optionally, at operation 412, additional small dummy POLY patterns are inserted in in small border regions. The insertion of the additional small dummy POLY patterns is based on the violations detected at operation 410. Likewise, in some implementations, the additional small dummy POLY patterns may be inserted in small border regions by EDA tools. As such, by performing operations 410 and 412 repeatedly, a certain minimum density of the small dummy POLY pattern 110 in the portion 104-1 of the small border region 104 can be assured. Therefore, the CMP dishing effect can be mitigated or minimized.

In an example, it has been observed that the CMP dishing effect has been significantly mitigated. The failure rate related to under-polish defects on a wafer without small dummy POLY patterns in small border regions is about 5.4%. In contrast, the failure rate related to under-polish defects on a wafer with small dummy POLY patterns in small border regions is about zero.

Example EDA Tool

Figure 11:
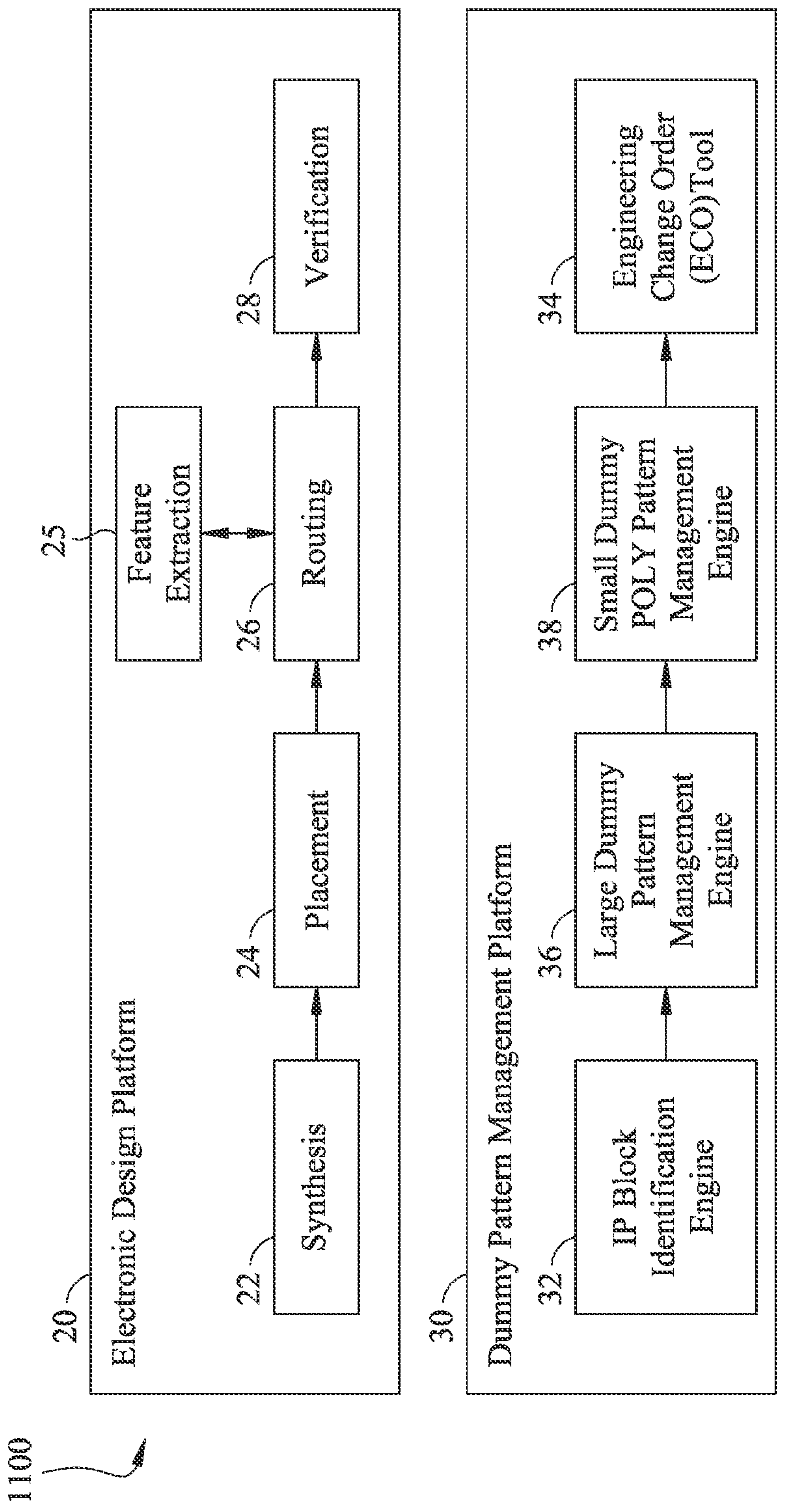
FIG. 11 is a block diagram illustrating an electronic device design system in accordance with some embodiments.

FIG. 11 is a block diagram illustrating an electronic device design system (also referred to as an "EDA tool") 1100 in accordance with some embodiments. The electronic device design system 1100 is operable to insert small dummy patterns in small border regions, as discussed above with reference to FIGS. 1-10. The electronic device design system 1100 includes, among other things, an electronic design platform 20 a dummy pattern management platform 30.

In some embodiments, the electronic design platform 20 and/or the dummy pattern management platform 30 may be implemented in hardware, firmware, software, or any combination thereof. For example, in some embodiments, the electronic design platform 20 and/or the dummy pattern management platform 30 may be at least partially implemented as instructions stored on a computer-readable storage medium, which may be read and executed by one or more computer processors or processing circuitry. The computer-readable storage medium may be, for example, read-only memory (ROM), random access memory (RAM), flash memory, hard disk drive, optical storage device, magnetic storage device, electrically erasable programmable read-only memory (EEPROM), organic storage media, or the like.

The electronic design platform 20 may include a plurality of electronic device design tools that may be implemented at least in part as software tools which, when executed by one or more computing devices, processors, or the like, can be utilized to design and generate one or more electronic circuit layouts, including electronic circuit placement layouts and associated routing for electronic devices circuits, which may include, for example, one or more ICs.

In some embodiments, the dummy pattern management platform 30 is a portion of the electronic design platform 20. In some embodiments, the electronic design platform 20 and the dummy pattern management platform 30 may be included in or otherwise implemented by a same apparatus, such as a same computing system or device. In other embodiments, the electronic design platform 20 and the dummy pattern management platform 30 may be included in or otherwise implemented by separate apparatuses, such as separate and remotely located computing systems or devices.

The electronic design platform 20 includes electronic device design tools which can be used, for example, to design high-level programming descriptions of analog and/or digital circuitry for an electronic device. In some embodiments, the high-level programming descriptions can be implemented using a high-level programming language, such as C, C++, LabVIEW, MATLAB, a general-purpose system design or modeling language, such as SysML, SMDL and/or SSDL, or any other suitable high-level programming language. In some embodiments, the electronic design platform 20 may include various additional features and functionalities, including, for example, one or more tools suitable to simulate, analyze, and/or verify the high-level programming descriptions of circuitry for the electronic device.

In the example shown in FIG. 11, the electronic design platform 20 includes, among other components, a synthesis tool 22, a placement tool 24, a feature extraction tool 25, and a routing tool 26, each of which may be implemented at least in part as software tools accessible to and executable by one or more computing devices, processors or the like.

The synthesis tool 22 translates one or more characteristics, parameters, or attributes of the electronic device into one or more logic operations, one or more arithmetic operations, one or more control operations, or the like, which may then be translated into the high-level programming descriptions in terms of the analog circuitry and/or the digital circuitry.

The placement tool 24 generates cells which correspond to, or otherwise implement, the one or more logic operations, one or more arithmetic operations, one or more control operations, or the like produced by the synthesis tool 22. The cells may include geometric shapes which correspond to various features of semiconductor devices, including, for example, diffusion layers, polysilicon layers, metal layers, and/or interconnections between layers. In some embodiments, the placement tool 24 may provide one or more high-level software level descriptions of the geometric shapes, the locations of the geometric shapes, and/or the interconnections between the geometric shapes.

In some embodiments, the geometric shapes for some of the analog circuitry and/or the digital circuitry can be defined in accordance with a standard cell from among a predefined library of standard cells associated with a technology library. The standard cell represents one or more semiconductor devices as well as their interconnection structures that are configured and arranged to provide a logical function, such as AND, OR, XOR, XNOR, or NOT, or a storage function, such as a flipflop or a latch. The predefined library of standard cells may be defined in terms of geometric shapes which correspond to diffusion layers, polysilicon layers, metal layers, and/or interconnections between layers. Thereafter, the placement tool 24 assigns locations for the geometric shapes on a printed circuit board (PCB) and/or a semiconductor substrate.

The electronic design platform 20 may perform clock tree synthesis (CTS) on a design generated, for example, by the placement tool 24. In some embodiments, the placement tool 24 may perform the clock tree synthesis. In other embodiments, a CTS tool may be included in the electronic design platform 20 to perform CTS on designs received from the placement tool 24. Clock tree synthesis generally refers to a process of synthesizing a clock tree to achieve zero or minimal skew and insertion delay, and may include inserting one or more buffers or inverters along clock paths of the electronic device design.

The routing tool 26 produces physical interconnections between the cells or the geometric shapes in the placement layout provided by the placement tool 24. In some embodiments, the routing tool 26 utilizes a textual or an image-based netlist describing the analog circuitry, the digital circuitry, the technology library, a semiconductor foundry for fabricating the electronic device and/or a semiconductor technology node for fabricating the electronic device to assign the interconnections between the geometric shapes.

The verification tool 28 may perform various verifications or checks on an electronic circuit placement layout, e.g., after placement and routing. For example, in some embodiments, the verification tool 28 can analyze the electronic circuit placement layout and can provide a static timing analysis (STA), a voltage drop analysis, also referred to as an IREM analysis, a Clock Domain Crossing Verification (CDC check), a formal verification, also referred to as model checking, equivalence checking, or any other suitable analysis and/or verification. In some embodiments, the verification tool 28 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the like.

The verification tool 28 verifies that the electronic device design, including the layout of the cells or geometric shapes provided by the placement tool 24, as well as the interconnections between the cells or geometric shapes provided by the routing tool 26, satisfies one or more specifications, rules, or the like associated with the electronic device design. The verification tool 28 may perform a physical verification, in which the verification tool 28 verifies whether an electronic device design is physically manufacturable, and that the resulting chips will meet the design specifications and will not have physical defects which prevent the chips from functioning as designed.

The verification tool 28 may perform a DRC (e.g., the DRC violations detected at operation 410 shown in FIG. 4) to determine whether the electronic device design, including the geometric shapes, the locations of the geometric shapes, and/or the interconnections between the geometric shapes assigned by the placement tool 24 and/or the routing tool 26, satisfies a series of recommended parameters, referred to as design rules, as may be defined by a semiconductor foundry and/or semiconductor technology node for fabricating the electronic device. The verification tool 28 may determine the presence of one or more DRC violations (e.g., violations of the first design rule and the second design rule discussed above with reference to FIGS. 7-10) in the electronic device design, and in some embodiments, the verification tool 28 may generate a DRC-violation map or report, which indicates a location of the one or more DRC violations in the electronic device design or sets forth a detailed report of all DRC violations.

The feature extraction tool 25 may perform feature extraction on the electronic circuit placement layout, including the physical interconnections between the cells or the geometric shapes in the placement layout produced by the routing tool 26. In other words, the feature extraction is performed at a post-routing stage. In some embodiments, the feature extraction tool 25 may extract information associated with one or more features of the electronic circuit placement layout. The extracted features may include any characteristics or parameters associated with the electronic circuit placement layout. In some embodiments, the feature extraction tool 25 analyzes a plurality of regions of the electronic circuit placement layout and extracts features associated with each of the plurality of regions. For example, the feature extraction tool 25 may perform feature extraction on each of a plurality of grid units of the electronic circuit placement layout and/or on each of a plurality of neighboring grid units of the electronic circuit placement layout. The feature extraction tool 25 may be implemented at least in part as software tools accessible to and executable by one or more computing devices, processors or the like. In some embodiments, the feature extraction tool 25 may be implemented as circuitry operable to perform any of the functions described herein with respect to the feature extraction tool 25.

The dummy pattern management platform includes, among other components, an IP block identification engine 32, a large dummy pattern management engine 36, a small dummy POLY pattern management engine 38, and an engineering change order (ECO) tool 34.

The IP block identification engine 32 is configured to identify IP blocks in an integrated circuit (e.g., operation 402 shown in FIG. 4) and identify border regions (e.g., operation 404 shown in FIG. 4). The IP block identification engine 32 may communicate with the feature extraction tool 25 and utilize the feature extraction provided by the feature extraction tool 25 to identify IP blocks and border regions.

The large dummy pattern management engine 36 is configured to insert large dummy patterns in large border regions (e.g., operation 406 shown in FIG. 4). The large dummy pattern management engine 36 is able to insert large dummy OD patterns and/or large dummy POLY patterns.

The small dummy POLY pattern management engine 38 is configured to insert small dummy POLY patterns in small border regions (e.g., operation 408 shown in FIG. 4) and insert additional small dummy POLY patterns in small border regions (e.g., operation 412 shown in FIG. 4).

Both the large dummy pattern management engine 36 and the small dummy POLY pattern management engine 38 may communicate with the placement tool 24 and utilize the functions of the placement tool 24 to insert large dummy OD patterns and/or large dummy POLY patterns and the small dummy POLY patterns, respectively.

The ECO tool is configured to control the small dummy POLY pattern management engine 38 to add additional small dummy POLY patterns in small border regions. The ECO tool is also configured to perform an ECO operation fix other DRC violations detected by the verification tool 28. An ECO operation is the process of inserting a logic change directly into the netlist after it has already been processed by an automatic tool. Before the chip masks are made, ECOs are usually done to save time, by avoiding the need for full ASIC logic synthesis, technology mapping, placement, routing, feature extraction, and timing verification. EDA tools are often built with incremental modes of operation to facilitate this type of ECO. Built-in ECO routing may help with implementing physical-level ECOs.

Figure 12:
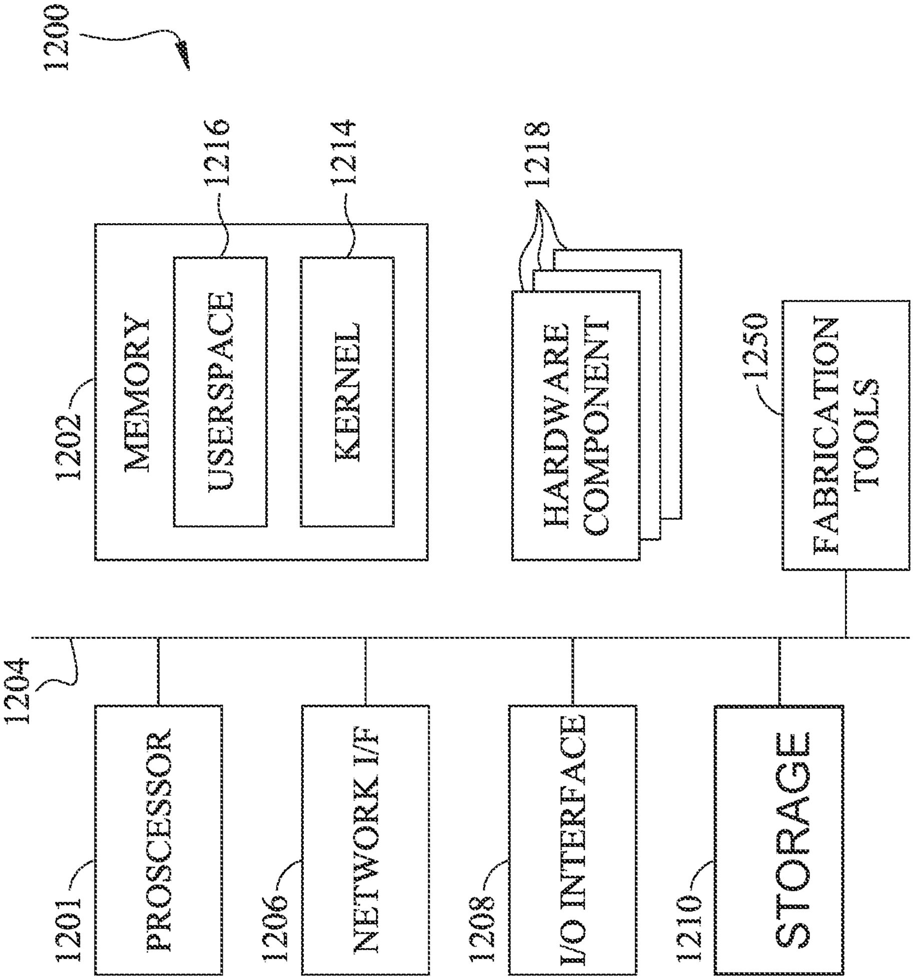
FIG. 12 is a block diagram of a computer system in accordance with some embodiments.

FIG. 12 is a block diagram of a computer system 1200 in accordance with some embodiments. One or more of the tools and/or systems and/or operations described with respect to FIGS. 1-11 are realized in some embodiments by one or more computer systems 1200 of FIG. 12. The computer system 1200 comprises a processor 1201, a memory 1202, a network interface (I/F) 1206, a storage device 1210, an input/output (I/O) device 1208, and one or more hardware components 1218 communicatively coupled via a bus 1204 or other interconnection communication mechanism.

The memory 1202 includes, in some embodiments, a random access memory (RAM) and/or other dynamic storage device and/or read only memory (ROM) and/or other static storage device, coupled to the bus 1204 for storing data and/or (processing) instructions to be executed by the processor 1201, e.g., kernel 1214, userspace 1216, portions of the kernel and/or the userspace, and components thereof. The memory 1202 is also used, in some embodiments, for storing temporary variables or other intermediate information during execution of instructions to be executed by the processor 1201.

In some embodiments, a storage device 1210, such as a magnetic disk or optical disk, is coupled to the bus 1204 for storing data and/or instructions, e.g., kernel 1214, userspace 1216, etc. The I/O device 1208 comprises an input device, an output device and/or a combined input/output device for enabling user interaction with the computer system 1200. An input device comprises, for example, a keyboard, keypad, mouse, trackball, trackpad, and/or cursor direction keys for communicating information and commands to the processor 1201. An output device comprises, for example, a display, a printer, a voice synthesizer, etc. for communicating information to a user.

In some embodiments, one or more operations and/or functionality of the tools and/or systems described with respect to FIGS. 1-11 are realized by the processor 1201, which is programmed for performing such operations and/or functionality. One or more of the memory 1202, the I/F 1206, the storage device 1210, the I/O device 1208, the hardware components 1218, and the bus 1204 are operable to receive instructions, data, design rules, netlists, layouts, models and/or other parameters for processing by the processor 1201.

In some embodiments, one or more of the operations and/or functionality of the tools and/or systems described with respect to FIGS. 1-11 are implemented by specifically configured hardware (e.g., by one or more application specific integrated circuits or ASIC(s)) which are included) separate from or in lieu of the processor 1201. Some embodiments incorporate more than one of the described operations and/or functionality in a single ASIC.

In some embodiments, the operations and/or functionality are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, or other suitable non-transitory computer readable recording medium.

The computer system 1200 may further include fabrication tools 1250 for implementing the processes and/or methods stored in the storage device 1210. For instance, a synthesis may be performed on a design in which the behavior and/or functions desired from the design are transformed to a functionally equivalent logic gate-level circuit description by matching the design to standard cells selected from a layout unit library. The synthesis results in a functionally equivalent logic gate-level circuit description, such as a gate-level netlist. Based on the gate-level netlist, a photolithographic mask may be generated that is used to fabricate the integrated circuit by the fabrication tools 1250. Further aspects of device fabrication are disclosed in conjunction with FIG. 13, which is a block diagram of IC manufacturing system 1300, and an IC manufacturing flow associated therewith, in accordance with some embodiments. In some embodiments, based on a layout diagram, at least one of (i) one or more semiconductor masks or (ii) at least one component in a layer of a semiconductor integrated circuit is fabricated using the IC manufacturing system 1300.

Figure 13:
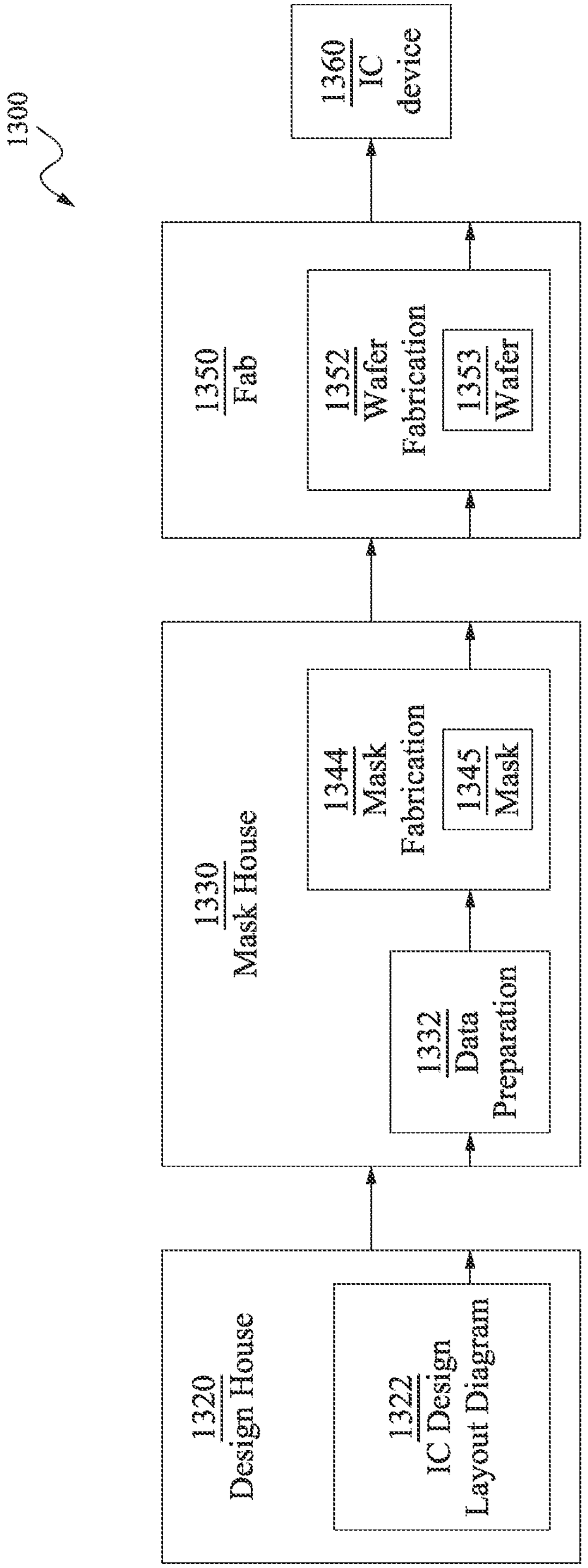
FIG. 13 is a block diagram of IC manufacturing system in accordance with some embodiments.

FIG. 13 is a block diagram of IC manufacturing system in accordance with some embodiments. In FIG. 13, the IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in the IC manufacturing system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 1320, mask house 1330, and IC fab 1350 is owned by a single larger company. In some embodiments, two or more of design house 1320, mask house 1330, and IC fab 1350 coexist in a common facility and use common resources.

The design house (or design team) 1320 generates an IC design layout diagram 1322. The IC design layout diagram 1322 includes various geometrical patterns, or IC layout diagrams designed for an IC device 1360. The geometrical patterns correspond to patterns of metal, oxide, or semiconductor layers that make up the various components of IC device 1360 to be fabricated. The various layers combine to form various IC features. For example, a portion of the IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 1320 implements a design procedure to form an IC design layout diagram 1322. The design procedure includes one or more of logic design, physical design or place and route. The IC design layout diagram 1322 is presented in one or more data files having information of the geometrical patterns. For example, IC design layout diagram 1322 can be expressed in a GDSII file format or DFII file format.

The mask house 1330 includes a data preparation 1332 and a mask fabrication 1344. The mask house 1330 uses the IC design layout diagram 1322 to manufacture one or more masks 1345 to be used for fabricating the various layers of the IC device 1360 according to the IC design layout diagram 1322. The mask house 1330 performs mask data preparation 1332, where the IC design layout diagram 1322 is translated into a representative data file ("RDF"). The mask data preparation 1332 provides the RDF to the mask fabrication 1344. The mask fabrication 1344 includes a mask writer. A mask writer converts the RDF to an image on a substrate, such as a mask (reticle) 1345 or a semiconductor wafer 1353. The IC design layout diagram 1322 is manipulated by the mask data preparation 1332 to comply with particular characteristics of the mask writer and/or requirements of the IC fab 1350. In FIG. 13, the mask data preparation 1332 and the mask fabrication 1344 are illustrated as separate elements. In some embodiments, the mask data preparation 1332 and the mask fabrication 1344 can be collectively referred to as a mask data preparation.

In some embodiments, the mask data preparation 1332 includes an optical proximity correction (OPC) which uses lithography enhancement techniques to compensate for image errors, such as those that can arise from diffraction, interference, other process effects and the like. The OPC adjusts the IC design layout diagram 1322. In some embodiments, the mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during the mask fabrication 1344, which may undo part of the modifications performed by OPC in order to meet mask creation rules.

In some embodiments, the mask data preparation 1332 includes lithography process checking (LPC) that simulates processing that will be implemented by the IC fab 1350 to fabricate the IC device 1360. LPC simulates this processing based on the IC design layout diagram 1322 to create a simulated manufactured device, such as the IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules. OPC and/or MRC are be repeated to further refine the IC design layout diagram 1322.

It should be understood that the above description of mask data preparation 1332 has been simplified for the purposes of clarity. In some embodiments, the mask data preparation 1332 includes additional features such as a logic operation (LOP) to modify the IC design layout diagram 1322 according to manufacturing rules. Additionally, the processes applied to the IC design layout diagram 1322 during the mask data preparation 1332 may be executed in a variety of different orders.

After the mask data preparation 1332 and during the mask fabrication 1344, a mask 1345 or a group of masks 1345 are fabricated based on the modified IC design layout diagram 1322. In some embodiments, the mask fabrication 1344 includes performing one or more lithographic exposures based on the IC design layout diagram 1322. In some embodiments, an electron-beam (e-beam) or a mechanism of multiple e-beams is used to form a pattern on a mask (photomask or reticle) 1345 based on the modified IC design layout diagram 1322. The mask 1345 can be formed in various technologies. In some embodiments, the mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 1345 includes a transparent substrate (e.g., fused quartz) and an opaque material (e.g., chromium) coated in the opaque regions of the binary mask. In another example, the mask 1345 is formed using a phase shift technology. In a phase shift mask (PSM) version of the mask 1345, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 1344 is used in a variety of processes. For example, such a mask(s) is used in an ion implantation process to form various doped regions in the semiconductor wafer 1353, in an etching process to form various etching regions in the semiconductor wafer 1353, and/or in other suitable processes.

The IC fab 1350 includes wafer fabrication 1352. The IC fab 1350 is an IC fabrication business that includes one or more manufacturing facilities for the fabrication of a variety of different IC products. In some embodiments, the IC fab 1350 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1350 uses mask(s) 1345 fabricated by the mask house 1330 to fabricate the IC device 1360. Thus, the IC fab 1350 at least indirectly uses the IC design layout diagram 1322 to fabricate the IC device 1360. In some embodiments, the semiconductor wafer 1353 is fabricated by the IC fab 1350 using mask(s) 1345 to form the IC device 1360. In some embodiments, the IC fabrication includes performing one or more lithographic exposures based at least indirectly on the IC design layout diagram 1322. The Semiconductor wafer 1353 includes a silicon substrate or other proper substrate having material layers formed thereon. The semiconductor wafer 1353 further includes one or more of various doped regions, dielectric features, multilevel interconnects, and the like (formed at subsequent manufacturing steps).

Summary

In accordance with some aspects of the disclosure, a method is provided. The method includes the following steps: identifying a first intellectual property (IP) block and a second IP block in an integrated circuit; identifying a small border region between the first IP block and the second IP block, wherein the small border region has a width in a first horizontal direction, and the width is between a small border region dimension lower limit and a small border region dimension upper limit; and inserting at least one small dummy gate feature pattern in the small border region.

In accordance with some aspects of the disclosure, A method is provided. The method includes the following steps: identifying a plurality of intellectual property (IP) blocks in an integrated circuit; identifying border regions in the integrated circuit, the border regions being outside the plurality of IP blocks and including at least one small border region and at least one large border region, wherein the small border region has a width in a first horizontal direction and a length in a second horizontal direction perpendicular to the first horizontal direction, and at least one of the width and the length is between a small border region dimension lower limit and a small border region dimension upper limit; and inserting at least one small dummy gate feature pattern in the at least one small border region.

In accordance with some aspects of the disclosure, an integrated circuit (IC) is provided. The IC includes: a substrate; a first intellectual property (IP) block fabricated on the substrate; a second IP block fabricated on the substrate; a small border region between the first IP block and the second IP block, wherein the small border region has a width in a first horizontal direction, and the width is between a small border region dimension lower limit and a small border region dimension upper limit; and at least one small dummy gate feature pattern disposed in the small border region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- identifying a first intellectual property (IP) block and a second IP block in an integrated circuit;
- identifying a small border region between the first IP block and the second IP block, wherein the small border region has a width in a first horizontal direction, and the width is between a small border region dimension lower limit and a small border region dimension upper limit; and
- inserting at least one small dummy gate feature pattern in the small border region.

2. The method of claim 1, wherein the small border region dimension upper limit is 3.6 μm.

3. The method of claim 2, wherein the small border region dimension lower limit is 0.5 μm.

4. The method of claim 1, wherein the at least one small dummy gate feature pattern includes a plurality of small dummy gate feature patterns.

5. The method of claim 4, wherein the plurality of small dummy gate feature patterns are organized in an array.

6. The method of claim 4, wherein each of the plurality of small dummy gate feature patterns has a width in the first horizontal direction between 0.01 μm and 0.2 μm and a length in a second horizontal direction perpendicular to the first horizontal direction between 0.1 μm and 0.5 μm.

7. The method of claim 6, wherein a distance in the first horizontal direction between two neighboring small dummy gate feature patterns of the plurality of small dummy gate feature patterns is between 0.05 μm and 0.2 μm.

8. The method of claim 6, wherein a distance in the second horizontal direction between two neighboring small dummy gate feature patterns of the plurality of small dummy gate feature patterns is between 0.05 μm and 0.2 μm.

9. The method of claim 4, wherein each of the plurality of small dummy gate feature patterns has a width in the first horizontal direction between 0.1 μm and 0.5 μm and a length in a second horizontal direction perpendicular to the first horizontal direction between 0.01 μm and 0.2 μm.

10. The method of claim 1 further comprising:
- scanning the small border region for a design rule check (DRC) violation.

11. The method of claim 10 further comprising:
- inserting at least one additional small dummy gate feature pattern in the small border region when the DRC violation is detected.

12. A method comprising:
- identifying a plurality of intellectual property (IP) blocks in an integrated circuit;
- identifying border regions in the integrated circuit, the border regions being outside the plurality of IP blocks and including at least one small border region and at least one large border region, wherein the small border region has a width in a first horizontal direction and a length in a second horizontal direction perpendicular to the first horizontal direction, and at least one of the width and the length is between a small border region dimension lower limit and a small border region dimension upper limit; and
- inserting at least one small dummy gate feature pattern in the at least one small border region.

13. The method of claim 12 further comprising:
- inserting at least one large dummy gate feature pattern in the at least one large border region.

14. The method of claim 13 further comprising:
- scanning the at least one small border region for a design rule check (DRC) violation.

15. The method of claim 14, wherein the scanning comprises:
- scanning the at least one small border region using a vertical rectangular area;
- scanning the at least one small border region using a horizontal rectangular area; and
- identifying a position of the vertical rectangular area or the horizontal rectangular area where not any small dummy POLY patterns overlap with the vertical rectangular area or the horizontal rectangular area, respectively.

16. The method of claim 15 further comprising:
- inserting at least one additional small dummy gate feature pattern in the identified position.

17. The method of claim 15, wherein the vertical rectangular area has a width in the first horizontal direction of 0.5

μm and a length in the second horizontal direction of 10 μm, and the horizontal rectangular area has a width in the first horizontal direction of 10 μm and a length in the second horizontal direction of 0.5 μm.

18. An integrated circuit (IC) comprising:

a substrate;

a first intellectual property (IP) block fabricated on the substrate;

a second IP block fabricated on the substrate;

a small border region between the first IP block and the second IP block, wherein the small border region has a width in a first horizontal direction, and the width is between a small border region dimension lower limit and a small border region dimension upper limit; and at least one small dummy gate feature pattern disposed in the small border region.

19. The integrated circuit of claim 18, wherein the small border region dimension upper limit is 3.6 μm, and wherein the small border region dimension lower limit is 0.5 μm.

20. The integrated circuit of claim 19, wherein the small dummy gate feature pattern has a width in the first horizontal direction between 0.01 μm and 0.2 μm and a length in a second horizontal direction perpendicular to the first horizontal direction between 0.1 μm and 0.5 μm.

* * * * *